United States Patent
Ishikawa

Patent Number: 6,069,494
Date of Patent: May 30, 2000

[54] METHOD AND APPARATUS FOR INTERFACING SEMICONDUCTOR DEVICES FOR TRANSFER THEREBETWEEN HAVING A SERIAL BUS FOR TRANSMITTING AMPLITUDE DATA FROM A MASTER DEVICE TO A SLAVE DEVICE

[75] Inventor: Toru Ishikawa, Tokyo, Japan

[73] Assignee: NEC Corporation, Tokyo, Japan

[21] Appl. No.: 08/953,717

[22] Filed: Oct. 17, 1997

[30] Foreign Application Priority Data

Oct. 18, 1996 [JP] Japan ................................. 8-297619

[51] Int. Cl.[7] ................... H03K 19/0175; H03K 19/094
[52] U.S. Cl. ............................... 326/86; 714/715
[58] Field of Search ........................... 375/231; 710/100, 710/110; 370/261, 263; 326/86; 327/20, 172; 324/158.1, 765; 714/712, 715

[56] References Cited

U.S. PATENT DOCUMENTS 5,353,305  10/1994  Fukuda et al. .......................... 375/231
5,452,308  9/1995  Kaminski et al. ...................... 710/100

FOREIGN PATENT DOCUMENTS 2-152321  6/1990  Japan .

*Primary Examiner*—Michael Tokar
*Assistant Examiner*—Patrick Wamsley
*Attorney, Agent, or Firm*—Sughrue, Mion, Zinn, Macpeak & Seas, PLLC

[57] ABSTRACT

Semiconductor devices which are interfaced to transfer a data signal therebetween are connected to each other by a first bus which transmits the data signal at a rate at which the amplitude of the data signal needs to be adjusted. Each of the semiconductor devices has an amplitude controller for adjusting the amplitude of the data signal. A second bus connects the semiconductor devices to each other, for transmitting amplitude data for determining an amplitude of the data signal at a rate at which the amplitude does not need to be adjusted.

20 Claims, 6 Drawing Sheets

//<br>6,069,494

METHOD AND APPARATUS FOR INTERFACING SEMICONDUCTOR DEVICES FOR TRANSFER THEREBETWEEN HAVING A SERIAL BUS FOR TRANSMITTING AMPLITUDE DATA FROM A MASTER DEVICE TO A SLAVE DEVICE

BACKGROUND OF THE INVENTION

1. Field of the Invention

The present invention relates to a method of and an apparatus for interfacing semiconductor devices that transfer data therebetween.

2. Description of the Related Art

A conventional method of and apparatus for interfacing semiconductor devices for transferring data therebetween will be described below with reference to FIGS. 1(a), 1(b), and 2 of the accompanying drawings.

As shown in FIG. 1(a), a master device 501 and a slave device 502 have respective interface circuits I/O for transmitting and receiving a data signal DT. The interface circuits I/O of the master device 501 and the slave device 502 are connected to each other by a bus 505 which carries the data signal DT. As shown in FIG. 1(b), the data signal DT is transmitted in synchronism with a clock signal Clk that is supplied from a clock generator 503 to the master device 501 and the slave device 502.

The master device 501 can access a plurality of slave devices. A slave device to be accessed is selected by a chip select signal CS that is issued from a decoder 504. The decoder 504 generates the chip select signal CS by decoding an address signal that is issued from the master device 501. The bus 505 is connected to and shared by the master device 501 and the plurality of slave devices.

In recent years, interface circuits have been required to meet requirements for high-speed data transfer. There has been proposed an interface circuit for transmitting and receiving a data signal by reducing the amplitude of the data signal to 1 V or less, for example.

If the amplitude of the transmitted data signal DT is reduced excessively, the receiving device is unable to recognize the data signal. Therefore, it is preferable to set the amplitude of the transmitted data signal DT to the minimum value that can be recognized by the receiving device.

One technique for setting the amplitude of a data signal to a desired value is disclosed in Japanese laid-open patent, publication No. 90-152321, for example. This publication proposes an output circuit capable of setting the amplitude of an output serial signal to a desired value, and describes a process of reducing the amplitude of the output signal for reducing noise such as high-frequency noise.

Specifically, the disclosed output circuit has a plurality of push-pull transistors, a plurality of resistors for establishing higher and lower potentials for the push-pull transistor, a plurality of transistors for selecting the resistors, and a plurality of registers for controlling the turning-on and -off of the transistors. The transistors are turned on or off according to amplitude data written in the registers. The output circuit outputs a serial signal at a potential that is determined by a voltage dividing ratio of the resistors which are selected when the transistors are turned on.

If the disclosed arrangement is applied to the interfacing apparatus shown in FIGS. 1(a) and 1(b), then an interface circuit as shown in FIG. 2 of the accompanying drawings is produced.

As shown in FIG. 2, a conventional interface circuit I/O comprises first and second registers 600, 601 for holding amplitude data to establish an amplitude of a data signal DT to be transmitted to a bus 505, I/O circuits 604 for outputting a data signal DT of a desired amplitude based on the amplitude data held by the first and second registers 600, 601, and an AND gate 603 for ANDing a chip select signal CS and a clock signal Clk. There are as many I/O circuits 604 as the number of bits of the bus 505.

Each of the I/O circuits 604 comprises a pair of push-pull transistors Q64, Q65 whose gates and drains are connected in common, a resistor R64 connected parallel between the source and drain of the push-pull transistor Q64, a resistor R65 connected parallel between the source and drain of the push-pull transistor Q65, resistors R61, R62, R63 having ends connected to the source of the push-pull transistor Q64, a transistor Q61 having a drain connected to the other end of the resistor R61 and a source connected to a voltage source Vdd, a transistor Q62 having a drain connected to the other end of the resistor R62 and a source connected to the voltage source Vdd, a transistor Q63 having a drain connected to the other end of the resistor R63 and a source connected to the voltage source Vdd, resistors R66, R67, R68 having ends connected to the source of the push-pull transistor Q65, a transistor Q66 having a drain connected to the other end of the resistor R66 and a source connected to a ground potential GND, a transistor Q67 having a drain connected to the other end of the resistor R67 and a source connected to the ground potential GND, a transistor Q68 having a drain connected to the other end of the resistor R68 and a source connected to the ground potential GND, and a flip-flop 602 for reading data on the bus 505 into the device in synchronism with an output signal from the AND gate 603.

The transistors Q61~Q63 have respective gates connected to output terminals of the first register 600, and the transistors Q66~Q68 have respective gates connected to output terminals of the second register 601. The first and second registers 600, 601 supply amplitude data to the I/O circuits 604, which are provided equal in number to the number N of bits of the bus 505.

The first register 600 holds amplitude data of a high potential (H level) for a data signal DT to be transmitted to the bus 505, and the transistors Q61~Q63 are turned on and off according to the amplitude data outputted from the first register 600. The second register 601 holds amplitude data of a low potential (L level) for a data signal DT to be transmitted to the bus 505, and the transistors Q66~Q68 are turned on and off according to the amplitude data outputted from the second register 601.

Since the transistors Q64, Q65 are push-pull transistors, when one of the transistors Q64, Q65 is turned on, the other is turned off. When the transistor Q64 is turned on and the transistor Q65 is turned off, the interface circuit outputs a data signal DT having an H level. When the transistor Q64 is turned off and the transistor Q65 is turned on, the interface circuit outputs a data signal DT having an L level.

For example, if the first and second registers 600, 601 hold amplitude data for turning on the transistors Q61, Q66 only, then, assuming that the resistances of the transistors Q61, Q66 as they are turned on are ignored, the potentials of the H level (VOH) and the L level (VOL) are determined according to a voltage dividing ratio of the resistors R61, R64, R65, R66 as follows:

$$VOH = [(R65+R66)/(R61+R65+R66)] \times Vdd \quad (1)$$

$$VOL = [R66/(R61+R64+R66)] \times Vdd \quad (2)$$

By changing the amplitude data outputted from the first and second registers 600, 601, the potentials of the H level (VOH) and the L level (VOL) can be set to a value determined according to a voltage dividing ratio of the combined resistance of the resistors R61~R63, the resistors R64, R65 and the combined resistance of the resistors R66~R68.

Therefore, the amplitude of the data signal DT outputted from the I/O circuit 604 can be changed by controlling the turning-on and -off of the transistors Q61~Q63 and the transistors Q66~Q68 by changing the amplitude data outputted from the first and second registers 600, 601.

FIG. 2 shows only the interface circuit of the slave device 502 shown in FIG. 1. However, the master device 501 shown in FIG. 1 may have the same interface circuit.

A process of optimizing the amplitude of the data signal DT outputted from the interface circuit shown in FIG. 2 will be described below.

(1) First, the master device 501 writes amplitude data into its own first and second registers so as to be able to transmit a data signal having a predetermined optimum amplitude.

(2) Then, the master device 501 transmits a command with the amplitude established in the above step (1) to the slave device 502, thus writing the amplitude data into the first and second registers 600, 601 of the slave device 502.

(3) After having received the command, the slave device 502 transmits, to the master device 501, arbitrary data with an amplitude which is represented by the amplitude data that have been received together with the command. The master device 501 ascertains whether it can recognize the received data or not.

(4) If the master device 501 is unable to recognize the received data, then the master device 501 transmits a command again to the slave device 502, together with amplitude data different from that transmitted in the step (2).

(5) After having received the command, the slave device 502 transmits, to the master device 501, arbitrary data with an amplitude which is represented by the amplitude data that have been received together with the command. The master device 501 ascertains whether it can recognize the received data or not.

(6) The steps (2)~(5) are repeated until the master device 501 can recognize the received data for thereby adjusting the amplitude of the data signal DT outputted from the slave device 502. The above process is carried out by a controller (not shown) which each of the master device 501 and the slave device 502 has.

The above conventional interface device has been disadvantageous in that if the amplitude of a command that is initially transmitted from the master device 501 to the slave device 502 is inappropriate, then since the slave device 502 fails to recognize the command from the master device 501, it is impossible to establish an amplitude of a data signal DT.

SUMMARY OF THE INVENTION

It is therefore an object of the present invention to provide a method of and an apparatus for interfacing semiconductor devices which transfer therebetween a data signal at a rate at which the amplitude of the data signal needs to be adjusted, while reliably optimizing the amplitude of the data signal.

To achieve the above object, there is provided in accordance with the present invention a method of interfacing semiconductor devices to transfer a data signal therebetween, the semiconductor devices being connected to each other by a first bus which transmits the data signal at a rate at which the amplitude of the data signal needs to be adjusted, each of the semiconductor devices having amplitude control means for adjusting the amplitude of the data signal, comprising the steps of connecting the semiconductor devices to each other with a second bus which transmits amplitude data for determining an amplitude of the data signal at a rate at which the amplitude does not needs to be adjusted, changing the amplitude data transmitted from one of the semiconductor devices to the other semiconductor device to allow the one semiconductor device to recognize a data signal returned from the other semiconductor device through the first bus with an amplitude according to the amplitude data, changing the amplitude of the data signal transmitted from the one semiconductor device to the other semiconductor device through the first bus until the data signal returned from the other semiconductor device and the data signal transmitted from the one semiconductor device to the other semiconductor device agree with each other, and determining an amplitude of the data signal transmitted from the one semiconductor device and an amplitude of the data signal transmitted from the other semiconductor device.

The other semiconductor device may have fixed-data generating means for generating predetermined fixed data, and the method may further comprise the step of ascertaining whether the one semiconductor device can recognize the predetermined fixed data returned from the other semiconductor device through the first bus.

The method may further comprise the step of transmitting a clock signal for the second bus for determining the timing to transmit the amplitude data, from the one semiconductor device to the other semiconductor device.

According to the present invention, there is also provided an apparatus for interfacing semiconductor devices to transfer a data signal therebetween, the semiconductor devices being connected to each other by a first bus which transmits the data signal at a rate at which the amplitude of the data signal needs to be adjusted, each of the semiconductor devices having amplitude control means for adjusting the amplitude of the data signal, comprising a second bus connecting the semiconductor devices to each other, for transmitting amplitude data for determining an amplitude of the data signal at a rate at which the amplitude does not need to be adjusted, and control means for changing the amplitude data transmitted from one of the semiconductor devices to the other semiconductor device to allow the one semiconductor device to recognize a data signal returned from the other semiconductor device through the first bus with an amplitude according to the amplitude data, changing the amplitude of the data signal transmitted from the one semiconductor device to the other semiconductor device through the first bus until the data signal returned from the other semiconductor device and the data signal transmitted from the one semiconductor device to the other semiconductor device agree with each other, and determining an amplitude of the data signal transmitted from the one semiconductor device and an amplitude of the data signal transmitted from the other semiconductor device.

The other semiconductor device may have fixed-data generating means for generating predetermined fixed data, and the control means may comprise means for ascertaining whether the one semiconductor device can recognize the predetermined fixed data returned from the other semiconductor device through the first bus.

The control means may comprise means for transmitting a clock signal for the second bus for determining the timing to transmit the amplitude data, from the one semiconductor device to the other semiconductor device.

With the above arrangement, since the second bus is provided which connects the semiconductor devices to each other, for transmitting amplitude data for determining an amplitude of the data signal at a rate that does not need the amplitude to be adjusted, the amplitude data can reliably be transmitted from the one semiconductor device to the other semiconductor device. Consequently, it is possible to reliably optimize the amplitude of a data signal that is transmitted from each of the semiconductor devices to the first bus.

The above and other objects, features, and advantages of the present invention will become apparent from the following description with references to the accompanying drawings which illustrate examples of the present invention.

DETAILED DESCRIPTION OF THE PREFERRED EMBODIMENTS

1st Embodiment:

A method of and an apparatus for interfacing semiconductor devices that transfer data therebetween according to a first embodiment of the present invention will be described below with reference to FIGS. 3 through 5.

Figure 1A:
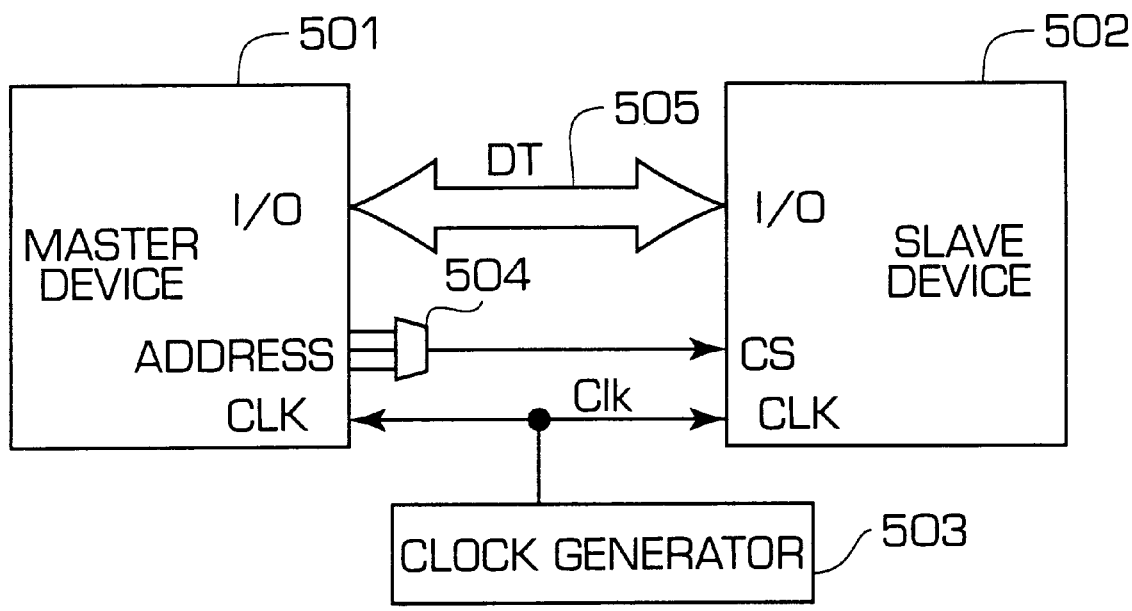
FIG. 1(a) is a block diagram of a conventional circuit arrangement which interfaces a master device and a slave device.
Figure 1B:
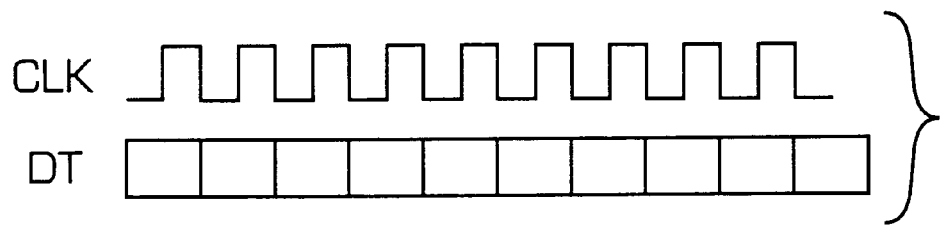
FIG. 1(b) is a timing chart showing the relationship between a clock signal supplied to the master device and the slave device shown in FIG. 1(a) and a data signal that is transmitted.
Figure 2:
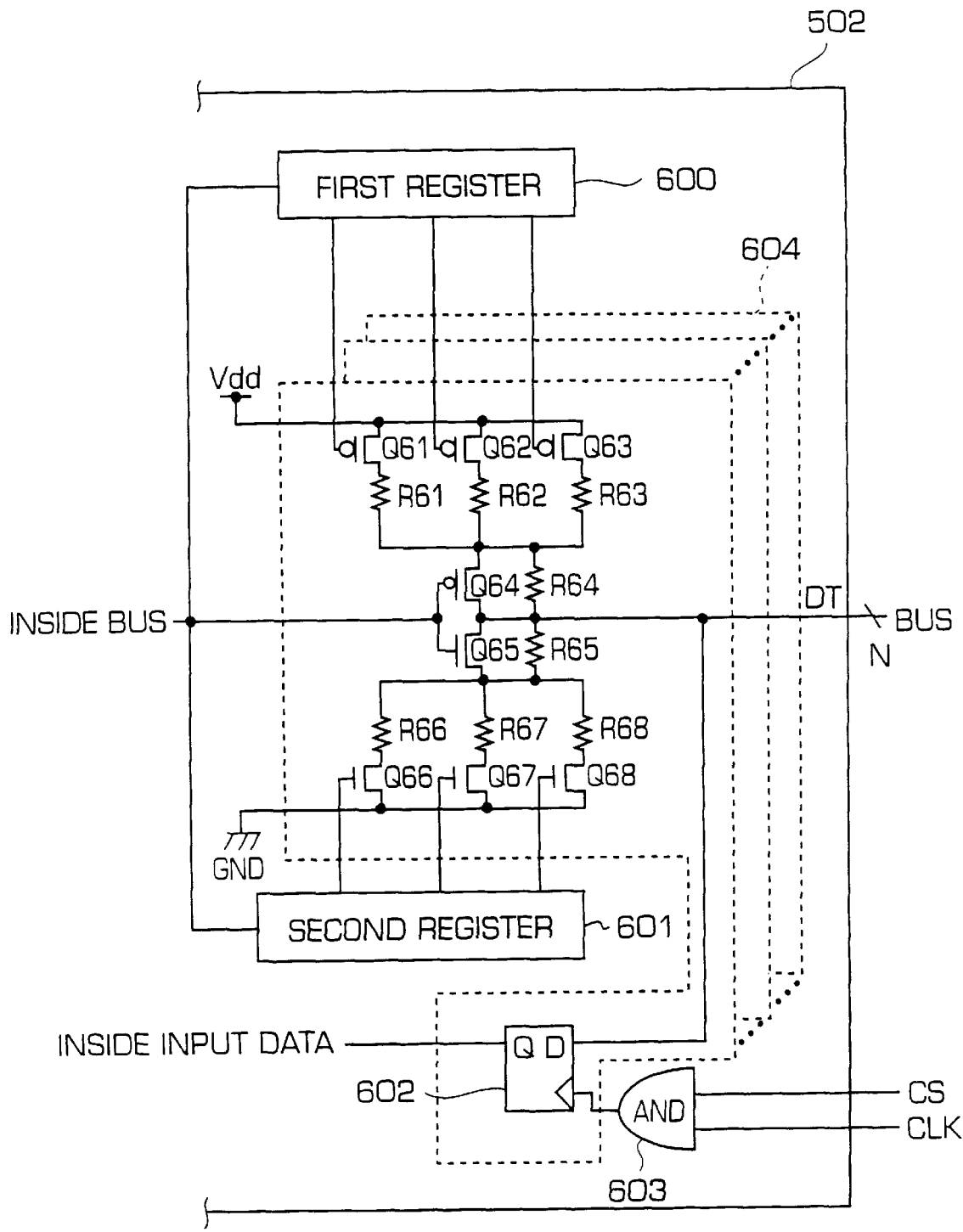
FIG. 2 is a circuit diagram, partly in block form, of a conventional interface circuit.
Figure 3:
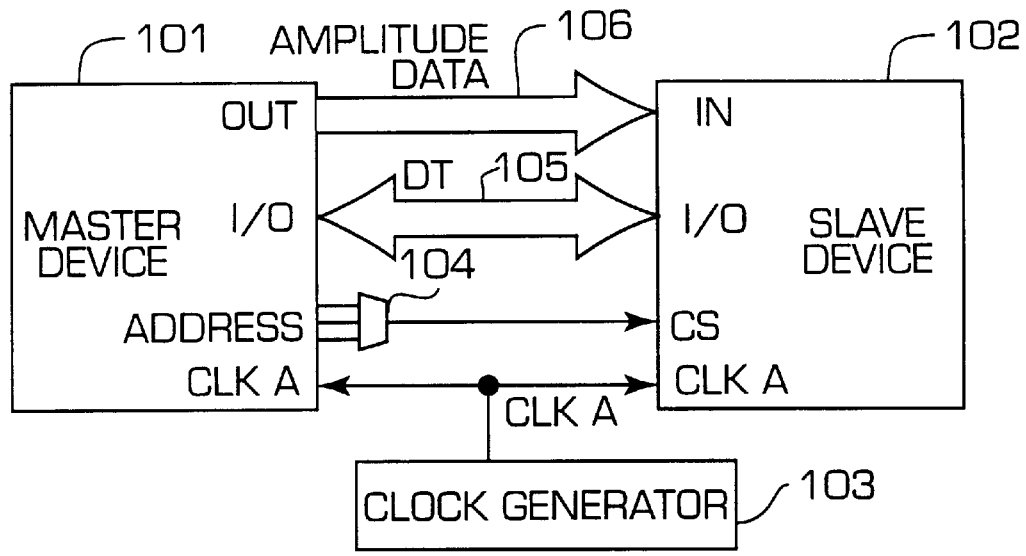
FIG. 3 is a block diagram of a circuit arrangement according to a first embodiment of the present invention which interfaces a master device and a slave device.

As shown in FIG. 3, a master device 101 and a slave device 102 have respective interface circuits I/O for transmitting and receiving a data signal DT. The interface circuits I/O of the master device 101 and the slave device 102 are connected to each other by a first bus 105 which carries the data signal DT. The data signal DT is transmitted in synchronism with a first clock signal ClkA that is supplied from a clock generator 103 to the master device 101 and the slave device 102.

The master device 101 and the slave device 102 are connected to each other by a second bus 106 which carries amplitude data of the data signal DT. The second bus 106 comprises a serial bus.

The master device 101 can access a plurality of slave devices. A slave device to be accessed is selected by a chip select signal CS that is issued from a decoder 104. The decoder 104 generates the chip select signal CS by decoding an address signal that is issued from the master device 101. The first and second buses 105, 106 are connected to and shared by the master device 101 and the plurality of slave devices.

Figure 4:
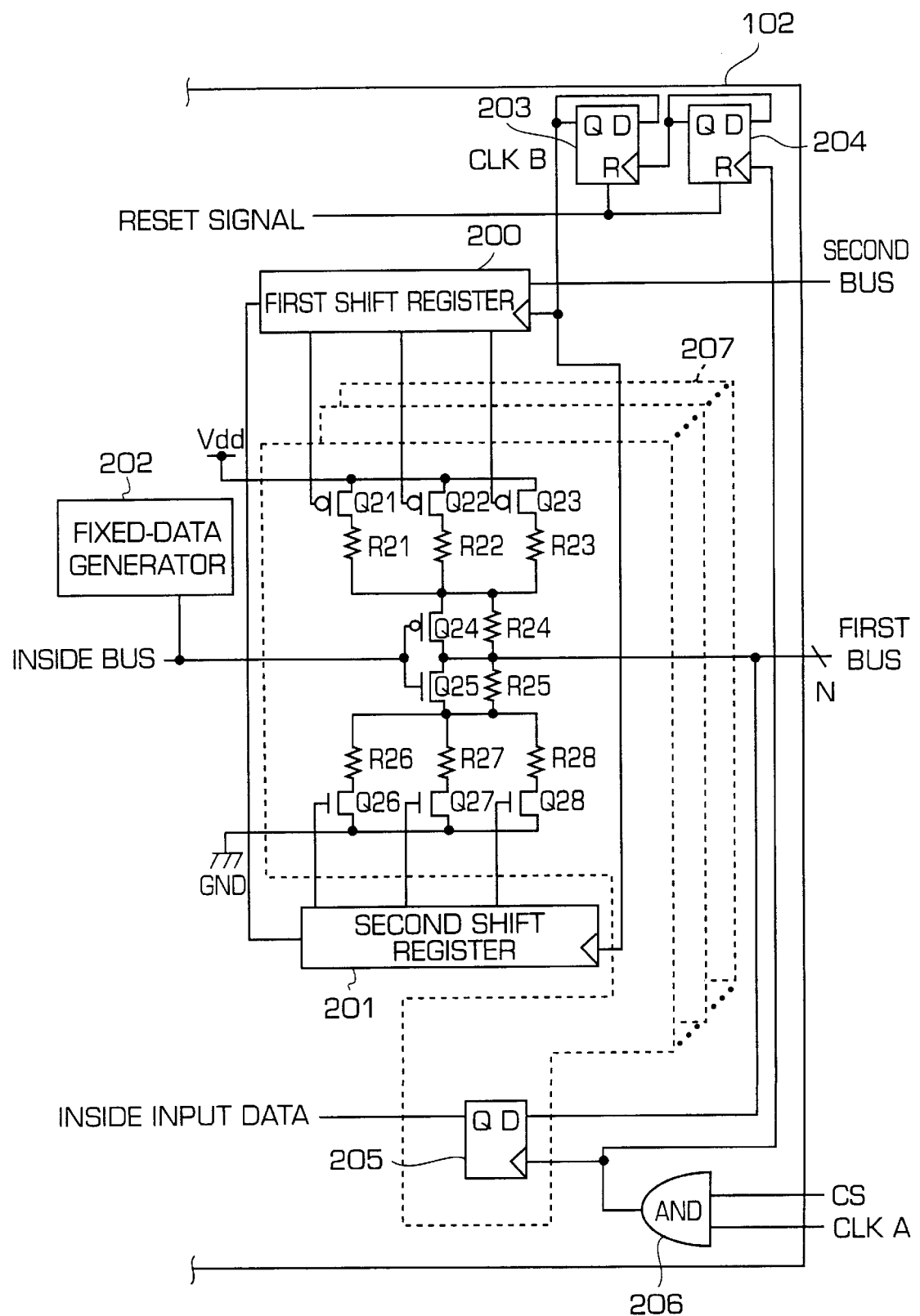
FIG. 4 is a circuit diagram, partly in block form, of an interface circuit according to the first embodiment of the present invention.

As shown in FIG. 4, each of the interface circuits I/O comprises first and second shift registers 200, 201 for holding amplitude data to establish an amplitude of a data signal DT to be transmitted to the first bus 105, I/O circuits 207 for outputting a data signal DT of a desired amplitude based on the amplitude data held by the first and second shift registers 200, 201, an AND gate 206 for ANDing a chip select signal CS and a first clock signal ClkA, a first D-type flip-flop 203 and a second D-type flip-flop 204 for frequency-dividing a clock signal outputted from the AND gate 206, and a fixed-data generator 202 for outputting predetermined fixed data. There are as many I/O circuits 207 as the number of bits of the first bus 105.

Each of the I/O circuits 207 comprises a pair of push-pull transistors Q24, Q25 whose gates and drains are connected in common, a resistor R24 connected parallel between the source and drain of the push-pull transistor Q24, a resistor R25 connected parallel between the source and drain of the push-pull transistor Q25, resistors R21, R22, R23 having ends connected to the source of the push-pull transistor Q24, a transistor Q21 having a drain connected to the other end of the resistor R21 and a source connected to a voltage source Vdd, a transistor Q22 having a drain connected to the other end of the resistor R22 and a source connected to the voltage source Vdd, a transistor Q23 having a drain connected to the other end of the resistor R23 and a source connected to the voltage source Vdd, resistors R26, R27, R28 having ends connected to the source of the push-pull transistor Q25, a transistor Q26 having a drain connected to the other end of the resistor R26 and a source connected to a ground potential GND, a transistor Q27 having a drain connected to the other end of the resistor R27 and a source connected to the ground potential GND, a transistor Q28 having a drain connected to the other end of the resistor R28 and a source connected to the ground potential GND, and a flip-flop 205 for reading data on the first bus 105 into the device in synchronism with an output signal from the AND gate 206.

The first shift register 200 has an input terminal connected to the second bus 106 and an output terminal connected to an input terminal of the second shift register 201. The first and second shift registers 200, 201 have respective clock input terminals connected to an output terminal Q of the first D-type flip-flop 203, which has an input terminal D connected to the output terminal Q in a feedback loop and also has a reset terminal R. The first D-type flip-flop 203 has a clock input terminal connected to an output terminal Q of the second D-type flip-flop 204, which has an input terminal D connected to the output terminal Q in a feedback loop and also has a reset terminal R. The second D-type flip-flop 204 has a clock input terminal connected to an output terminal of the AND gate 206. The output terminal of the AND gate 206 is connected to a clock input terminal of the flip-flop 205.

The transistors Q21~Q23 have respective gates connected to output terminals of the first shift register 200, and the transistors Q26~Q28 have respective gates connected to output terminals of the second shift register 201. The first and second shift registers 200, 201 supply amplitude data to the I/O circuits 207, which are provided equal in number to the number N of bits of the first bus 105.

The first shift register 200 holds amplitude data of a high potential (H level) for a data signal DT to be transmitted to the first bus 105, and the transistors Q21~Q23 are turned on and off according to the amplitude data outputted from the first shift register 200. The second shift register 201 holds amplitude data of a low potential (L level) for a data signal DT to be transmitted to the first bus 105, and the transistors Q26~Q28 are turned on and off according to the amplitude data outputted from the second shift register 201.

Since the transistors Q24, Q25 are push-pull transistors, when one of the transistors Q24, Q25 is turned on, the other is turned off. When the transistor Q24 is turned on and the transistor Q25 is turned off, the interface circuit outputs a data signal DT having an H level. When the transistor Q24 is turned off and the transistor Q25 is turned on, the interface circuit outputs a data signal DT having an L level.

By changing the amplitude data outputted from the first and second shift registers 200, 201, the potentials of the H level (VOH) and the L level (VOL) can be set to a value determined according to a voltage dividing ratio of the combined resistance of the resistors R21~R23, the resistors R24, R25 and the combined resistance of the resistors R26~R28.

Therefore, the amplitude of the data signal DT outputted from the I/O circuit 207 can be changed by controlling the turning-on and -off of the transistors Q21~Q23 and the transistors Q26~Q28 by changing the amplitude data outputted from the first and second shift registers 200, 201.

Figure 5:
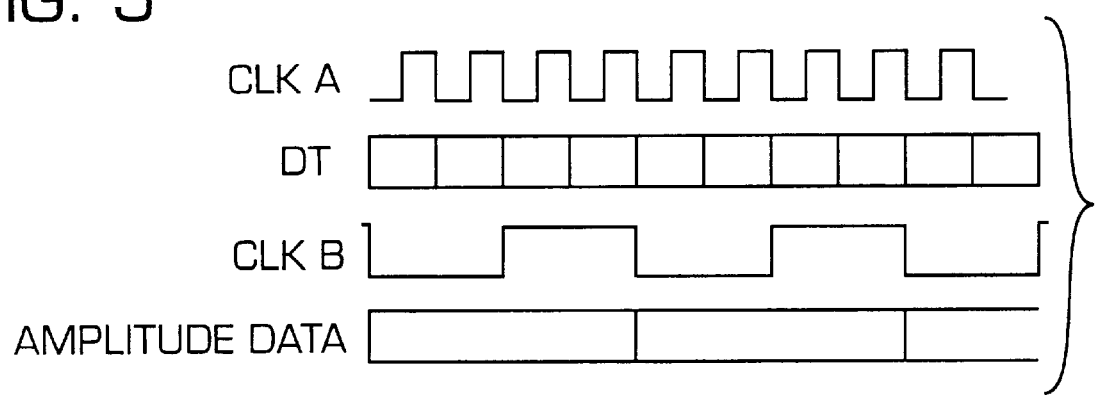
FIG. 5 is a timing chart showing the relationship between a clock signal supplied to the master device and the slave device shown in FIG. 3 and a data signal that is transmitted.

As shown in FIG. 5, the data signal DT is transmitted over the first bus 105 in synchronism with the first clock signal ClkA. The amplitude data transmitted over the second bus 106 is transmitted in synchronism a second clock signal ClkB which is generated by frequency-driving the first clock signal ClkA with the first and second D-type flip-flops 203, 204. Therefore, the amplitude data has a data cycle that is four times that of the data signal DT.

If the first bus 105 has a data transmission rate of 400 MHz, then the second bus 106 has a data transmission rate of 100 MHz. With the data transmission rate of 100 MHz, it is possible to transmit and receive data signals without adjusting their amplitudes.

If fixed data issued from the fixed-data generator 202 represents "0101", for example, then the interface circuit according to the first embodiment optimizes the amplitude of a data signal according to the following process:

(1) First, the master device 101 transmits amplitude data through the second bus 106 to the first and second shift registers 200, 201 of the slave device 102.

(2) Then, the slave device 102 transmits fixed data outputted from the fixed-data generator 202, with an amplitude represented by the received amplitude data, to the first bus 105. The master device 101 ascertains whether it can recognize the received fixed data or not.

(3) If the master device 101 is unable to recognize the received fixed data, then the master device 101 transmits amplitude data different from that transmitted in the step (1) through the second bus 106 to the first and second shift registers 200, 201 of the slave device 102.

(4) The slave device 102 outputs fixed data with an amplitude according to the amplitude data transmitted in the step (3), to the first bus 105. The master device 101 ascertains whether it can recognize the received fixed data or not.

(5) The master device 101 and the slave device 102 repeat the steps (1)~(4) until the master device 101 can recognize the fixed data.

At this time, the amplitude of the data signal DT transmitted from the slave device 102 to the first bus 105 is optimized.

(6) Then, the master device 101 writes amplitude data into its own first and second shift registers, and transmits an arbitrary data signal with an amplitude according to the written amplitude data through the first bus 105 to the slave device 102.

(7) The slave device 102 returns the same data signal as the received data signal to the master device 101, and the master device 101 confirms the contents of the data signal that has been returned.

(8) If the returned data signal is different from the transmitted data signal, then because the amplitude of the data signal transmitted from the master device 101 is considered to be in appropriate, the master device 101 writes again amplitude data into its own first and second shift registers, and transmits an arbitrary data signal with an amplitude according to the written amplitude data through the first bus 105 to the slave device 102.

(9) The slave device 102 returns the same data signal as the received data signal to the master device 101, and the master device 101 confirms the contents of the data signal that has been returned. The steps (6)~(8) are repeated until the returned data signal and the transmitted data signal agree with each other.

The above process optimizes the amplitude of the data signal DT transmitted from the slave device 102 to the first bus 105. The above process is carried out by a controller (not shown) which each of the master device 101 and the slave device 102 has.

It is thus possible to send amplitude data reliably to from the master device 101 to the slave device 102 through the second bus 106 which has a lower data transmission rate than the first bus 105 and which is capable of transmitting and receiving amplitude data between the master device 101 and the slave device 102 even without controlling the amplitude of the data signal DT. Accordingly, the amplitude of the data signal DT transmitted from both the master device 101 and the slave device 102 can reliably be optimized.

Figure 8:
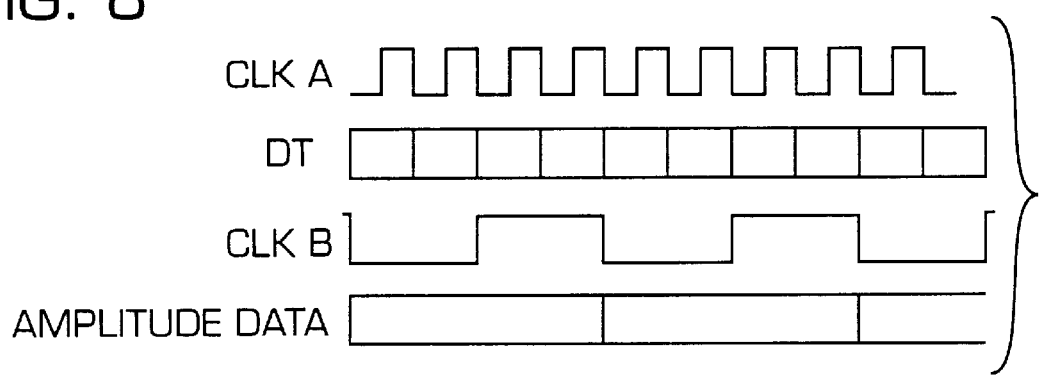
FIG. 8 is a timing chart showing the relationship between a clock signal supplied to the master device and the slave device shown in FIG. 6 and a data signal that is transmitted.

2nd Embodiment:

A method of and an apparatus for interfacing semiconductor devices that transfer data therebetween according to a second embodiment of the present invention will be described below with reference to FIGS. 6 through 8.

Figure 6:
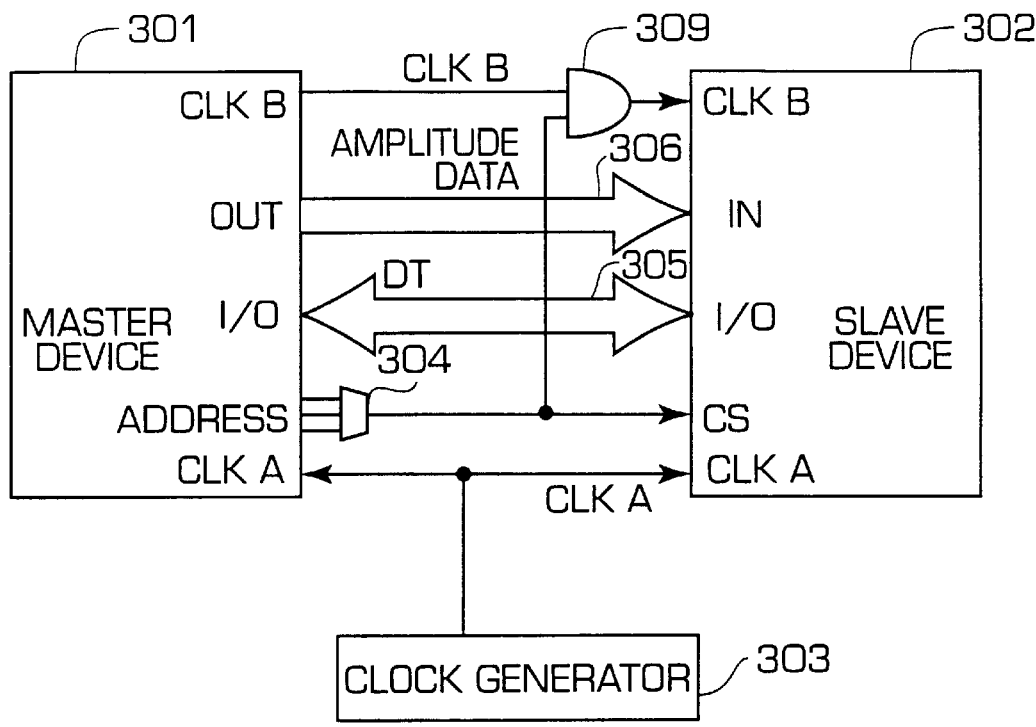
FIG. 6 is a block diagram of a circuit arrangement according to a second embodiment of the present invention which interfaces a master device and a slave device.

As shown in FIG. 6, a master device 301 and a slave device 302 have respective interface circuits I/O for transmitting and receiving a data signal DT. The interface circuits I/O of the master device 301 and the slave device 302 are connected to each other by a first bus 305 which carries the data signal DT. The data signal DT is transmitted in synchronism with a first clock signal ClkA that is supplied from a clock generator 303 to the master device 301 and the slave device 302.

The master device 301 and the slave device 302 are connected to each other by a second bus 306 which carries amplitude data of the data signal DT. The second bus 306 comprises a serial bus.

The slave device 302 is supplied with a second clock signal ClkB for the second bus 306 from the master device 301. The second clock signal ClkB that is outputted from the master device 301 is applied to an input terminal of an AND gate 309, whose other input terminal is supplied with a chip select signal CS. Therefore, the second clock signal ClkB is supplied to only the slave device 302 that is selected by the chip select signal CS.

The master device 301 can access a plurality of slave devices. A slave device to be accessed is selected by the chip select signal CS that is issued from a decoder 304. The decoder 304 generates the chip select signal CS by decoding an address signal that is issued from the master device 301.

The first and second buses 305, 306 are connected to and shared by the master device 301 and the plurality of slave devices.

Figure 7:
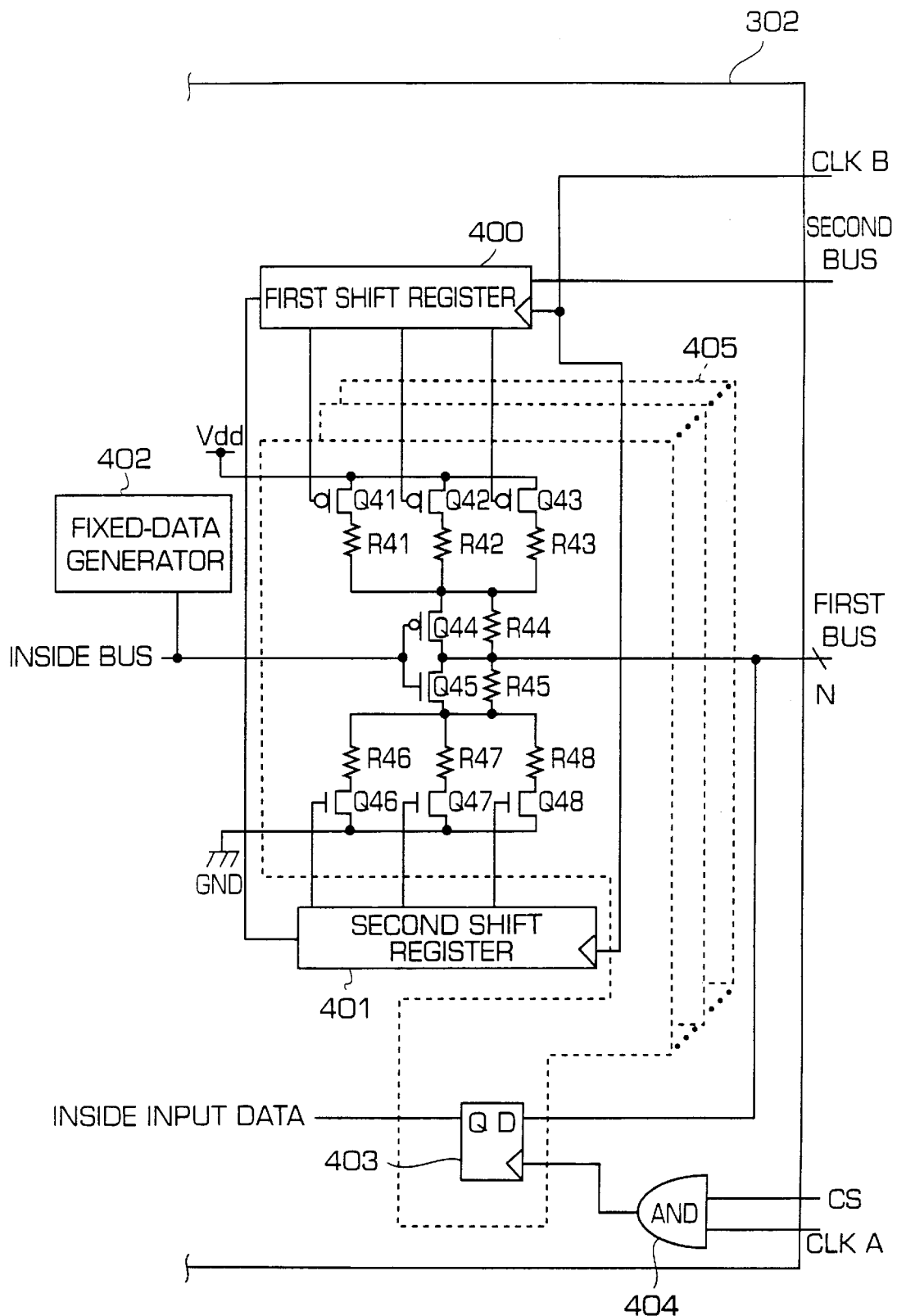
FIG. 7 is a circuit diagram, partly in block form, of an interface circuit according to the second embodiment of the present invention.

As shown in FIG. 7, each of the interface circuits I/O comprises first and second shift registers 400, 401 for holding amplitude data to establish an amplitude of a data signal DT to be transmitted to the first bus 305, I/O circuits 405 for outputting a data signal DT of a desired amplitude based on the amplitude data held by the first and second shift registers 400, 401, an AND gate 404 for ANDing a chip select signal CS and a first clock signal ClkA, and a fixed-data generator 402 for outputting predetermined fixed data. There are as many I/O circuits 405 as the number of bits of the first bus 305.

Each of the I/O circuits 405 comprises a pair of push-pull transistors Q44, Q45 whose gates and drains are connected in common, a resistor R44 connected parallel between the source and drain of the push-pull transistor Q44, a resistor R45 connected parallel between the source and drain of the push-pull transistor Q45, resistors R41, R42, R43 having ends connected to the source of the push-pull transistor Q44, a transistor Q41 having a drain connected to the other end of the resistor R41 and a source connected to a voltage source Vdd, a transistor Q42 having a drain connected to the other end of the resistor R42 and a source connected to the voltage source Vdd, a transistor Q43 having a drain connected to the other end of the resistor R43 and a source connected to the voltage source vdd, resistors R46, R47, R48 having ends connected to the source of the push-pull transistor Q45, a transistor Q46 having a drain connected to the other end of the resistor R46 and a source connected to a ground potential GND, a transistor Q47 having a drain connected to the other end of the resistor R47 and a source connected to the ground potential GND, a transistor Q48 having a drain connected to the other end of the resistor R48 and a source connected to the ground potential GND, and a flip-flop 403 for reading data on the first bus 305 into the device in synchronism with an output signal from the AND gate 404.

The first shift register 400 has an input terminal connected to the second bus 306 and an output terminal connected to an input terminal of the second shift register 401. The first and second shift registers 400, 401 have respective clock input terminals which are supplied with the second clock signal ClkB from the master device 301.

In the first embodiment, the slave device 102 frequency-divides the first clock signal ClkA into the second clock signal ClkB for the second bus 106. In order to generate the second clock signal ClkB with the timing shown in FIG. 5, the slave device 102 needs to control the timing of the resetting of the first D-type flip-flop 203 and the second D-type flip-flop 204.

According to the second embodiment, however, since the second clock signal ClkB is supplied from the master device 301 to only the selected slave device 302. Therefore, the slave device 302 is not required to control the timing of the second clock signal ClkB therein.

Other details of the operation of the interface circuit and the process of optimizing the amplitude of the data signal DT according to the second embodiment are the same as those of the first embodiment, and will not be described in detail.

It is to be understood that variations and modifications of the method of and the apparatus for interfacing semiconductor devices that transfer data therebetween disclosed herein will be evident to those skilled in the art. It is intended that all such modifications and variations be included within the scope of the appended claims.

What is claimed is:

1. A method of interfacing a plurality of semiconductor devices to transfer a data signal therebetween, comprising the steps of:
    connecting said plurality of semiconductor devices to each other with a first bus for transmitting said data signal;
    connecting said plurality of semiconductor devices to each other with a second bus for transmitting amplitude data for said data signal;
    transmitting amplitude data from a first device of said plurality of semiconductor devices to a second device of said plurality of semiconductor devices, and further comprising the steps of:
        creating a first test signal having an amplitude according to said amplitude data;
        transmitting said first test signal from said second device to said first device; and
        changing said amplitude data until said first device recognizes said first test signal transmitted from said second device; and
    transmitting a second test signal from said first device to said second device, and further comprising the steps of:
        creating a second test signal;
        transmitting said second test signal from said second device to said first device;
        retransmitting or returning said second test signal from said second device to said first device; and
        changing the amplitude of said second test signal until said first device recognizes said second test signal retransmitted from said second device.

2. The method as set forth in claim 1, wherein the step of creating a first test signal further comprises generating known data for insertion into said first test signal.

3. The method as set forth in claim 1, wherein the step of creating said second test signal further comprises generating arbitrary data for insertion into said second test signal.

4. The method as set forth in claim 1, further comprising the step of synchronizing the transmission of said amplitude data from said first device to said second device with a clock signal.

5. The method as set forth in claim 1, further comprising the step of storing in said second device said amplitude data transmitted from said first device.

6. The method as set forth in claim 1, further comprising the step of storing in said first device amplitude data concerning said second test signal.

7. An apparatus for transferring a data signal, comprising:
    a plurality of semiconductor devices, each device further comprising a data port, an amplitude port and a data signal amplitude controller;
    a first bus for transmitting said data signal, said first bus connected to said data port of each of said plurality of semiconductor devices;
    a second bus for transmitting amplitude data, said second bus connected to said amplitude port of each of said plurality of semiconductor devices; and
    a plurality of controllers, wherein each controller controls one of said plurality of semiconductor devices.

8. The apparatus as set forth in claim 7, wherein the controller of a first device of said plurality of semiconductor devices causes said first device to transmit said amplitude data to a second device of said plurality of semiconductor devices.

9. The apparatus as set forth in claim 8, wherein the controller of said second device creates a first test signal having an amplitude set according to said amplitude data, and transmits said first test signal to said first device.

10. The apparatus as set forth in claim 9, wherein said second device generates known data for insertion into said first test signal.

11. The apparatus as set forth in claim 10, wherein each of said plurality of semiconductor devices further comprises a data signal amplitude controller.

12. The apparatus as set forth in claim 11, wherein the controller of said second device inputs said amplitude data into the data signal amplitude controller of said second device to change the amplitude of said first test signal.

13. The apparatus as set forth in claim 8, further comprising a synchronizer for synchronizing the transmission of said amplitude data from said first device to said second device with a clock signal.

14. The apparatus as set forth in claim 8, wherein said controller of one of said plurality of semiconductor devices acts as a master controller, and the controllers of the remaining devices of said plurality of semiconductor devices act as slave controllers.

15. The apparatus as set forth in claim 7, wherein the controller of a first device of said plurality of semiconductor devices causes said first device to transmit a second test signal to a second device of said plurality of semiconductor devices.

16. The apparatus as set forth in claim 15, wherein said first device creates arbitrary data for insertion into said second test signal.

17. The apparatus as set forth in claim 16, wherein each of said plurality of semiconductor devices further comprises a data signal amplitude controller.

18. The apparatus as set forth in claim 17, wherein the controller of said first device adjusts the data signal amplitude controller of said first device to control the amplitude of said second test signal until said first device recognizes said arbitrary data embodied in said second test signal.

19. The apparatus as set forth in claim 15, wherein the controller of said second device causes said second device to transmit or return said second test signal received from said first device back to said first device.

20. The apparatus as set forth in claim 7, wherein each of said plurality of semiconductor devices further comprises registers for storing amplitude data.

* * * * *